United States Patent
Rumsey et al.

(10) Patent No.: US 6,762,434 B2
(45) Date of Patent: Jul. 13, 2004

(54) ELECTRICAL PRINT RESOLUTION TEST DIE

(75) Inventors: Robert W. Rumsey, Campbell, CA (US); Hiu F Ip, San Jose, CA (US); Arthur Lam, Fremont, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 10/422,165

(22) Filed: Apr. 23, 2003

(65) Prior Publication Data

US 2003/0210058 A1 Nov. 13, 2003

Related U.S. Application Data (62) Division of application No. 10/114,703, filed on Apr. 1, 2002, now Pat. No. 6,649,932.

(51) Int. Cl.⁷ .............................................. H01L 23/58
(52) U.S. Cl. ........................................................ 257/48
(58) Field of Search ........................... 257/48; 324/765, 324/258; 365/201

(56) References Cited

U.S. PATENT DOCUMENTS

| | | | | |
|---|---|---|---|---|
| RE37,184 E | * | 5/2001 | Kushiyama | 365/201 |
| 6,429,454 B2 | * | 8/2002 | Hatada | 257/48 |
| 6,483,304 B1 | * | 11/2002 | Kou | 324/258 |
| 6,492,832 B2 | * | 12/2002 | Choi | 324/765 |

* cited by examiner

*Primary Examiner*—John F. Niebling
*Assistant Examiner*—Andre C. Stevenson
(74) *Attorney, Agent, or Firm*—Patent Law Group LLP; David C. Hsia (57) ABSTRACT

A test structure pattern includes a first comb, a second comb, and a serpentine line. The first comb includes a first set of tines of the same orientation. The second comb includes a second set of tines of the same orientation that are interdigitated with the first set of tines. The serpentine line runs between the interdigitated tines of the first metal comb and the second metal comb. The test structure pattern forms a first metal comb, a second metal comb, and a serpentine metal line on a die. Print quality and resolution is tested by checking for electrical continuity in the serpentine metal line and bridging between the serpentine metal line and one of the first metal comb and the second metal comb.

3 Claims, 7 Drawing Sheets

ELECTRICAL PRINT RESOLUTION TEST DIE

CROSS REFERENCE TO RELATED APPLICATION

This application is a divisional of application Ser. No. 10/114,703, filed on Apr. 1, 2002 now U.S. Pat. No. 6,649,932 entitled "Electrical Print Resolution Yian Test Die" of the same inventors hereof, which application is incorporated herein by reference in its entirety.

FIELD OF THE INVENTION

This invention relates to test structures used in semiconductor manufacturing, and in particular to test structures used to determine the print quality and resolution of in a lithographic process.

DESCRIPTION OF RELATED ART

Photomasks are an integral component in the lithographic process of semiconductor manufacturing. Semiconductor manufacturers use photomasks to optically transfer (e.g., print) images of devices (e.g., integrated circuits) onto semiconductor wafers. A lithography tool called stepper projects light through the photomask to print the image of one or more devices onto a field on a silicon wafer coated with photoresist. The stepper then moves (e.g., steps) the wafer and the image is exposed once again onto another field on the wafer. This process is repeated for the entire wafer surface. When using a positive photoresist, the exposed portions of the photoresist are removed so areas of the wafer underneath can either be etched to form channels or be deposited with other materials. This process can be reversed using a negative photoresist where the unexposed portions of the photoresist are removed.

In lithography, the print resolution is critical. Print resolution is the smallest line and space that can be precisely printed (matching the mask dimension.) Print resolution depends predominately on the focus of the stepper, but could also depend on various other factors. For example, if the stepper is not able to print one micron at a particular time, then the stepper cannot be used to produce one micron devices until maintenance and repair are performed.

Thus, what is needed is an apparatus and method for processing engineers to detect stepper problems before they affect the production runs.

SUMMARY OF THE INVENTION

In one embodiment of the invention, a test structure pattern includes a first comb, a second comb, and a serpentine line. The first comb includes a first set of tines of the same orientation. The second comb includes a second set of tines of the same orientation that are interdigitated with the first set of tines. The serpentine line runs between the interdigitated tines of the first comb and the second comb. The test structure pattern forms a first metal comb, a second metal comb, and a serpentine metal line on a die.

In one embodiment, electrical continuity is checked on the serpentine metal line. If a current cannot flow through in the serpentine metal line, then the serpentine metal line is broken or discontinuous. This suggests the resolution of the stepper is compromised due to being overexposed or out of focus.

In another embodiment, electrical continuity is also checked between the serpentine metal line and at least the first metal comb and/or the second metal comb. If a current can flow between the serpentine metal line and either the first metal comb or the second metal comb, then this implies there is bridging across a gap where there should not be any conductance. This suggests the resolution of the stepper is compromised due to being underexposed or out of focus.

DETAILED DESCRIPTION

Figure 1:
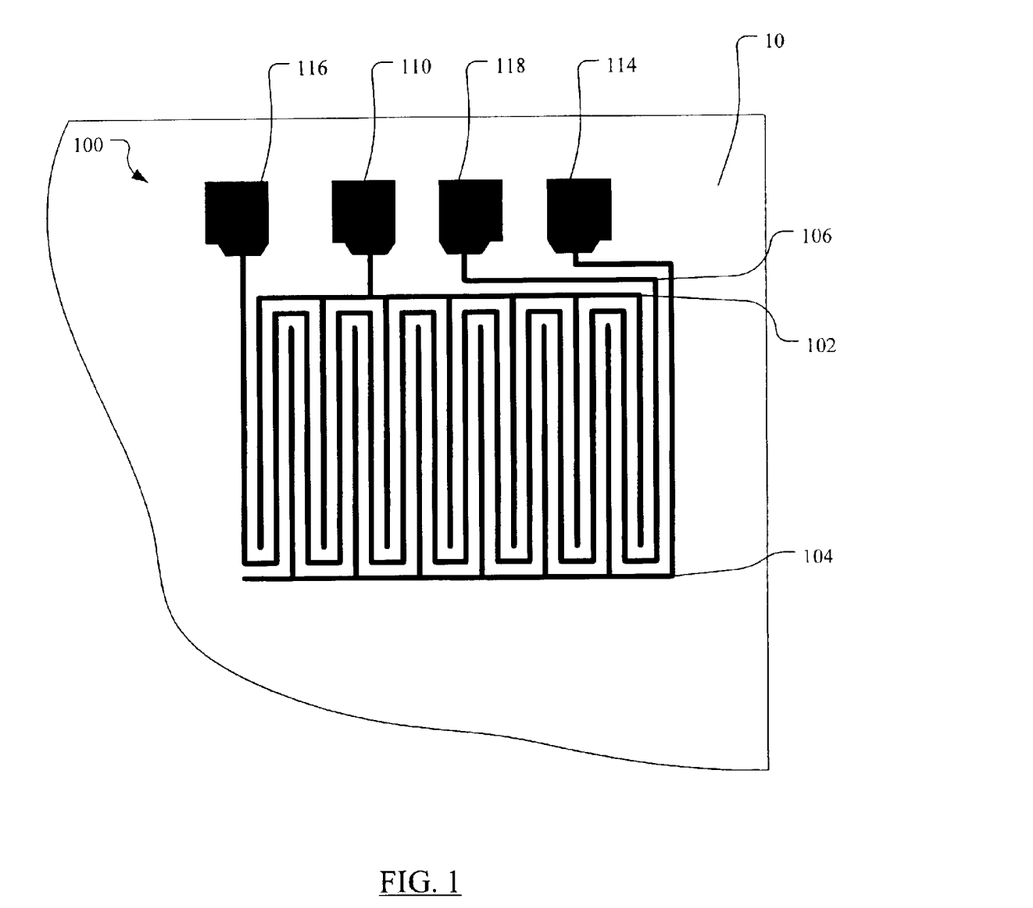
FIG. 1 illustrates a test structure pattern for electrically detecting the print quality and resolution of a lithographic process in one embodiment of the invention.

FIG. 1 illustrates a test structure pattern 100 on a photomask 10 used with positive (or negative) photoresist in one embodiment of the invention. Test structure pattern 100 forms a test die 600 (FIG. 6) for electrically detecting the print quality and resolution in a lithographic process.

Figure 2:
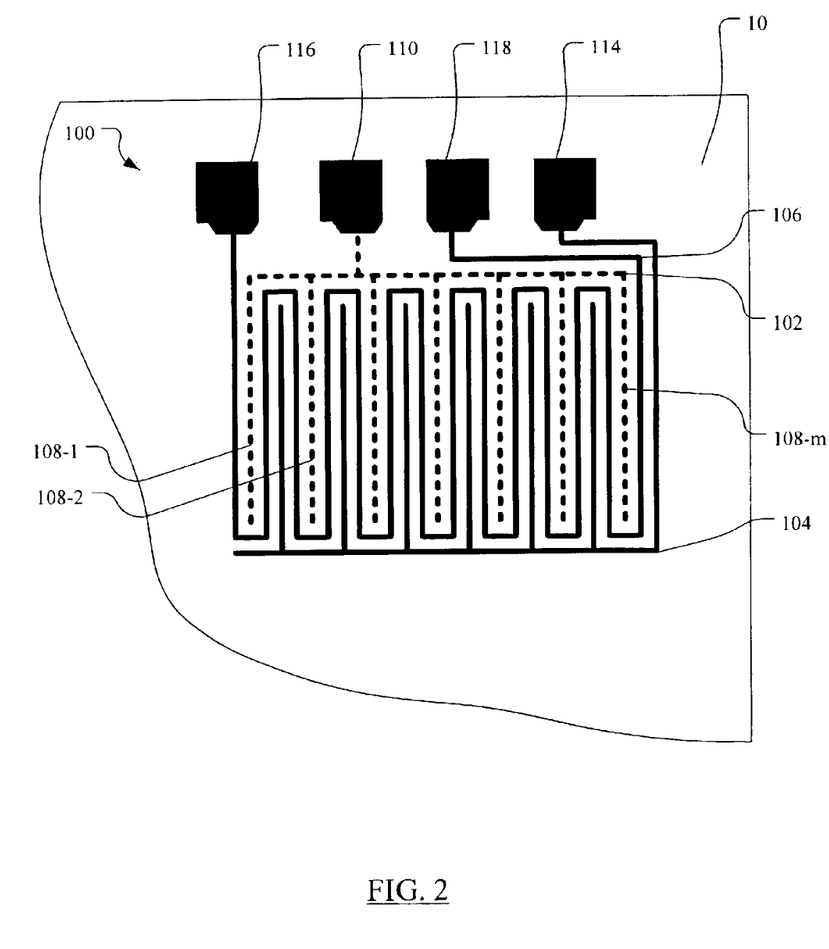
FIG. 2 illustrates the test structure pattern of FIG. 1 where an upper comb is shown with dashed lines.

Test structure pattern 100 includes an upper comb 102, a lower comb 104, and a serpentine line 106. Upper comb 102 (as shown more clearly in FIG. 2 with dashed lines) includes a number of upper tines 108-1, 108-2, . . . , 108-m (collectively as "upper tines 108") all of the same orientation (e.g., vertical). Upper tines 108 are coupled in parallel to a bond pad 110.

Figure 3:
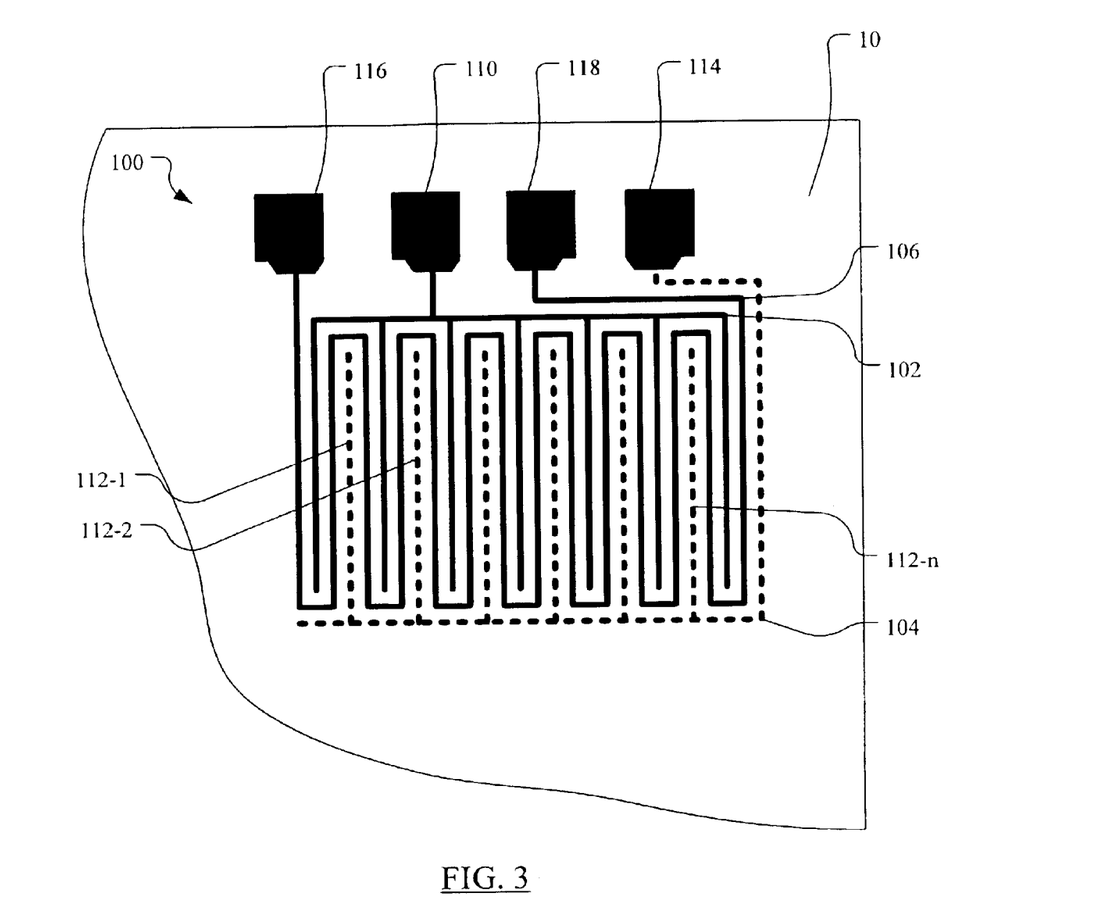
FIG. 3 illustrates the test structure pattern of FIG. 1 where a lower comb is shown with dashed lines.

Similarly, lower comb 104 (as shown more clearly in FIG. 3 with dashed lines) includes a number of lower tines 112-1, 112-2, . . . , 112-n (collectively as "lower tines 112") all of the same orientation as upper tines 108. Lower tines 112 are coupled in parallel to a bond pad 114. Lower tines 112 are interdigitated with upper tines 108.

Figure 4:
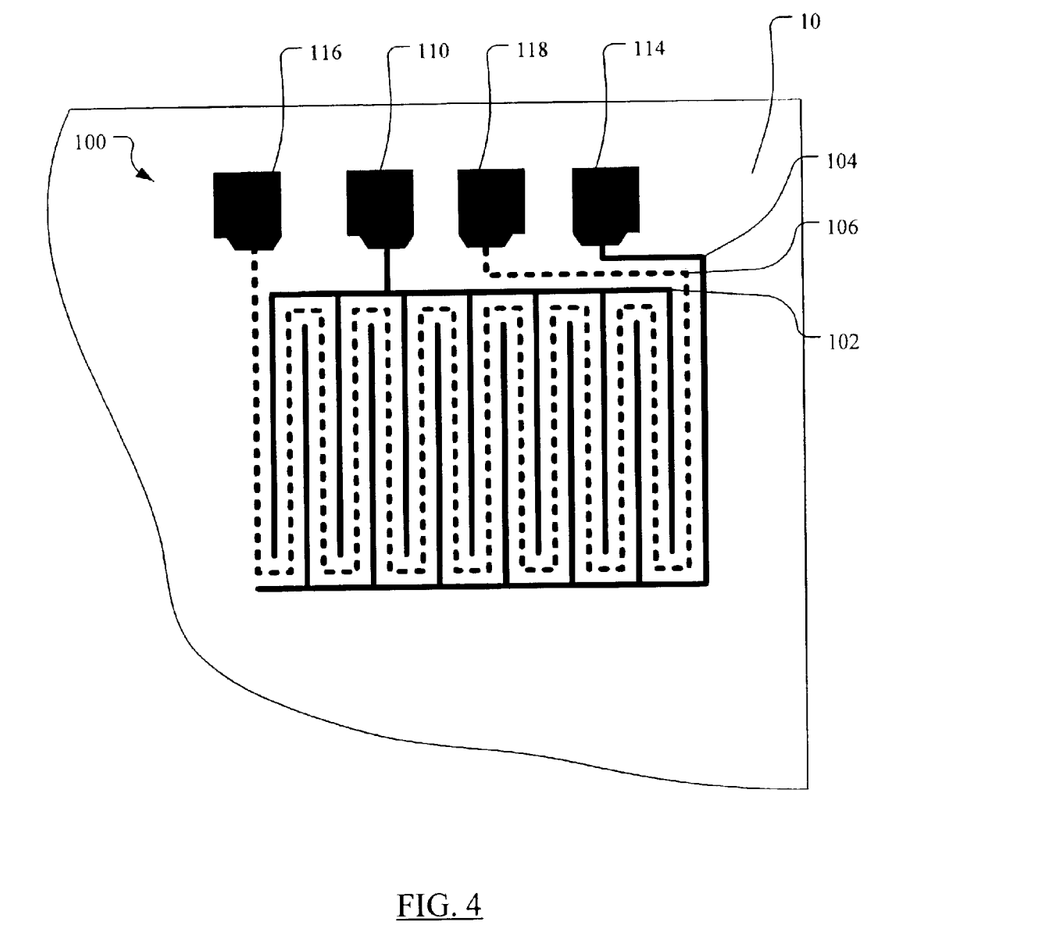
FIG. 4 illustrates the test structure pattern of FIG. 1 where a serpentine line is shown with a dashed line.

Serpentine line 106 (as shown more clearly in FIG. 4 with a dashed line) runs back and forth between the interdigitated lower and upper tines. One end of line 106 is coupled to a bond pad 116, and the other end of line 106 is coupled to a bond pad 118.

Figure 5:
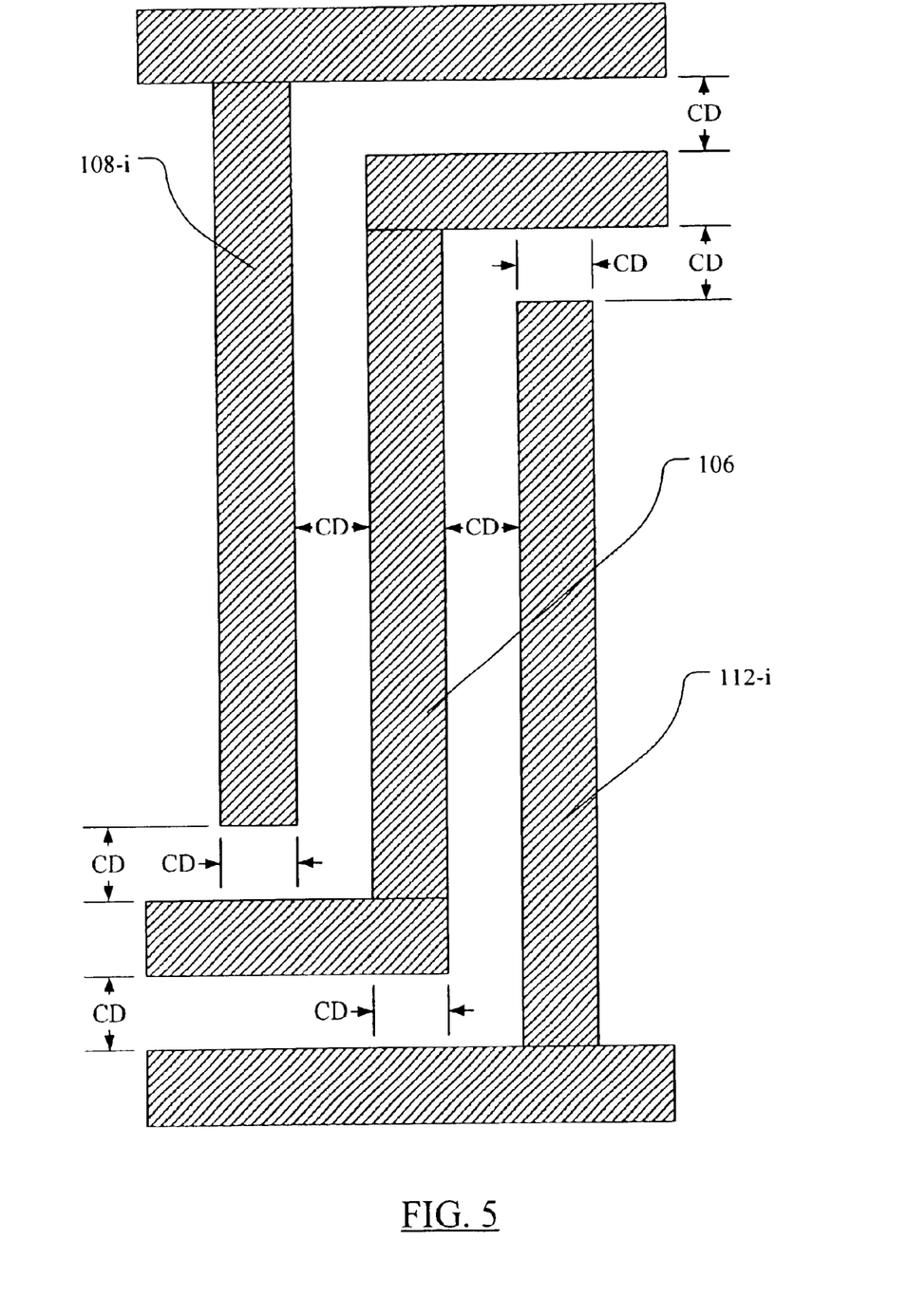
FIG. 5 illustrates an enlarge view of a part of the serpentine line, a tine of the upper comb, and a tine of the lower comb in one embodiment of the invention.

FIG. 5 illustrates an exemplary cutout of test structure pattern 100. As can be seen, serpentine line 106, upper tines 108, and lower tines 112 are separated from each other by a critical dimension CD (except in the corner). Each of serpentine line 106, upper tines 108, and lower tines 112 has a width of critical dimension CD.

Figure 6:
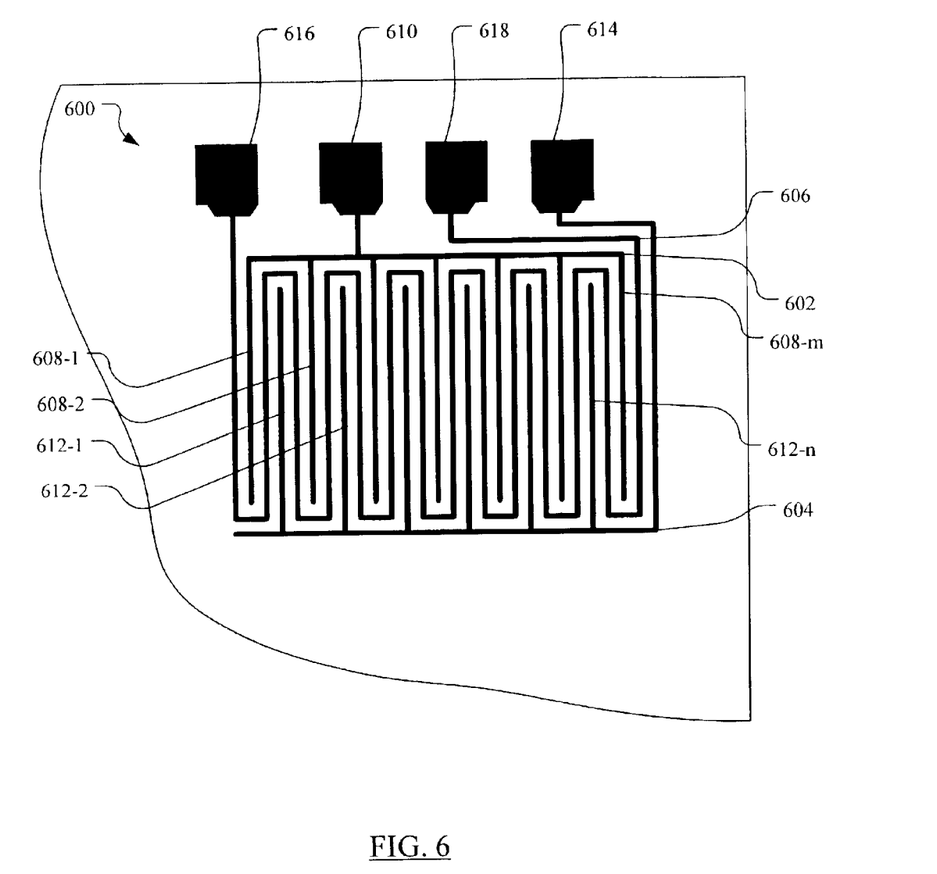
FIG. 6 illustrates a test die formed from the test structure pattern of FIG. 1 in one embodiment of the invention.

FIG. 6 illustrates an exemplary a test die 600 formed from test structure pattern 100 printed on photoresist over a conductive layer on a wafer. The conductive layer is generally above a dielectric layer on the wafer. Test die 600 includes a metal upper comb 602 with metal tines 608, a metal lower comb 604 with metal tines 612, a metal serpentine line 606, and metal bond pads 110, 114, 116, and 118.

To evaluate the print quality and resolution, test die 600 is measured for continuity of metal line 606, upper bridging between metal line 606 and upper comb 602, and lower bridging between metal line 606 and lower comb 604. For these tests, an electrical current is supplied to pad 616 and the current is checked at pads 610, 614, and 618.

If the electrical current is not detected at pad 618, then metal line 606 is not continuous. Metal line 606 is not continuous when the lithographic process is unable to print and/or etch metal line 606 with a width of critical dimension CD. Thus, metal line 606 becomes too narrow and breaks somewhere along its path. It is also possible too tell how much narrower the line is by comparing measured resistance values to known good samples with known metal thicknesses. Since the length is fixed then any change in resistance would be indicate a change in width (metal CD).

If the electrical current is detected at pad 610, then metal line 606 has contacted one or more of upper tines 608. Similarly, if the electrical current is detected at pad 614, then metal line 606 has contacted one or more of lower tines 612. Metal line 606 contacts upper tines 608 or lower tines 612 when the lithographic process is unable to print and/or etch them with a width of critical dimension CD. Thus, one or more of metal line 606, upper tines 608, or lower tines 612 become too wide and they touch somewhere along their paths.

A number of reasons could have caused the metal lines and tines to become too narrow or too wide, including focus and distortion problems of the stepper, etching defects of the etcher, resist thickness that is out of spec, particles or other defects, and handling damage.

Figure 7:
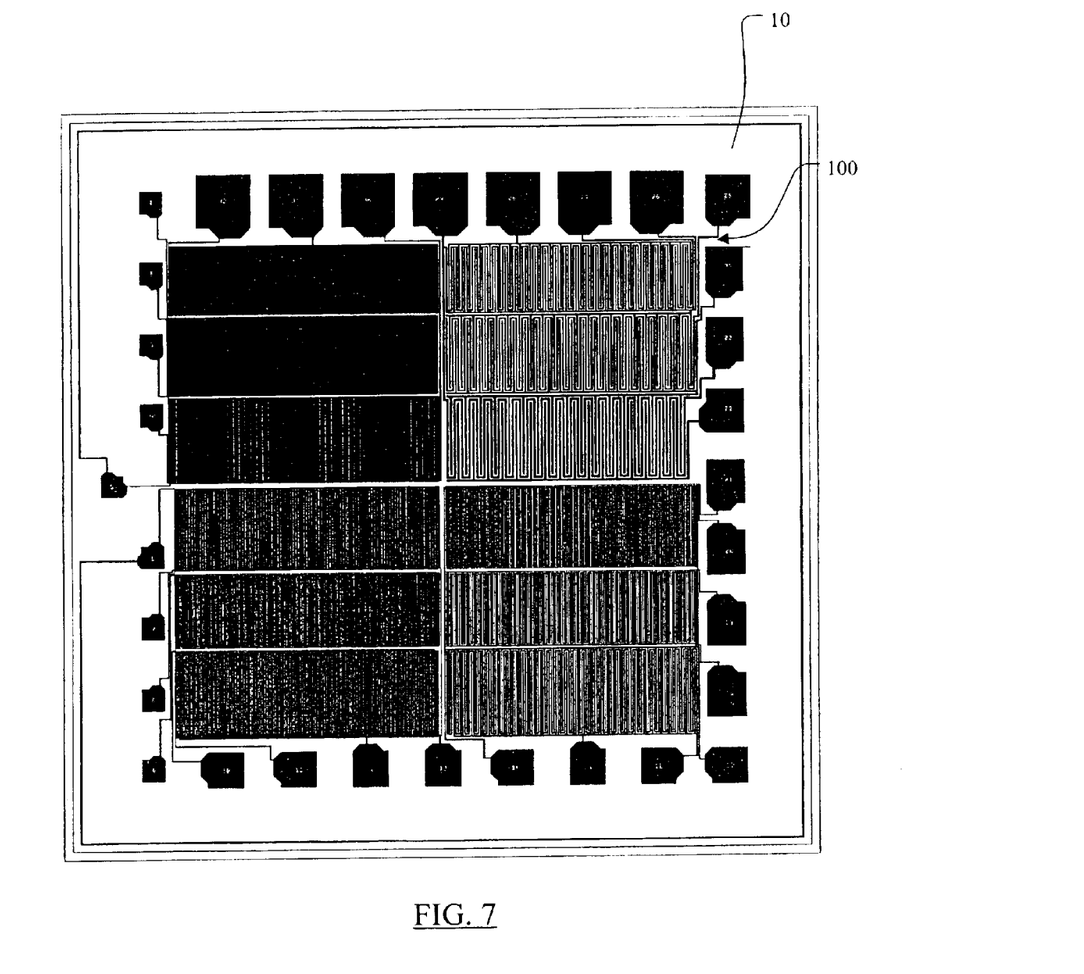
FIG. 7 illustrates multiple test structure patterns of FIG. 1 with decrementing critical dimensions on a photomask for electrically detecting the print quality and resolution of a lithographic process in one embodiment of the invention.

FIG. 7 illustrates that test structure pattern 100 can be repeated on photomask 10 with different decrementing critical dimension CDs. Thus, photomask 10 printed on a single field to determine the smallest critical dimension CD produced by a specific lithographic process.

Test structure pattern 100 with the interdigitated and serpentine patterns offers a good test for print quality and resolution because the elements on the test die are densely packed. However, other test structures with constant width and constant gap through a long path can also be used to test print quality and resolution. For example, lines that form concentric circles, scrolling jet vanes, and twisting conical shells can possibly be used in other test structures.

In one embodiment, the actual dimension CD of metal line 606 can be determined. A resistance R of metal line 606 between metal pads 616 and 618 can be determined from the voltage drop and the supplied current. Resistance R can be correlated for the type of the metal layer to the width, length, and thickness of metal line 606. The length of metal line 606 is measured during layout of the test die (during CAD). The thickness of metal line 606 can be measured after metal deposition by using a V/I 4 point probe (or equivalent) that converts resistivity to thickness. If the length and the thickness are known, then the width of metal line 606 can be conventionally calculated.

In one embodiment, the sizes of bond pads 110, 114, 116, and 118 are varied. Measurements can be taken between each resulting metal bond pad and the substrate to qualify the capacitive quality of the dielectric layer between the metal layer and the substrate. Furthermore, if a current is detected between a metal bond pad and the substrate, then there are particles on the wafer. Thus, the bond pads can also be used for defect monitoring.

Various other adaptations and combinations of features of the embodiments disclosed are within the scope of the invention. As understood by one skilled in the art, the concepts discussed herein can be implemented with a photomask used with negative photoresist where the transmission characteristics are reversed. Numerous embodiments are encompassed by the following claims.

What is claimed is:

1. A method for determine print resolution, comprising:
   forming:
   a first metal comb comprising a first set of tines;
   a first pad coupled in parallel to the first set of tines;
   a second metal comb opposite of the first metal comb, the second metal comb comprising a second set of tines interdigitated with the first set of tines;
   a second pad coupled in parallel to the second set of tines:
   a serpentine metal line running between the interdigitated tines of the first metal comb and the second metal comb;
   a third pad coupled to a first end of the serpentine metal line; and
   a fourth pad coupled to a second end of the serpentine metal line;
   supplying a current to the fourth pad; and
   detecting the current at the third pad.

2. The method of claim 1, wherein the resolution is too poor, out of focus, or overexposed if the current is not detected at the third pad.

3. The method of claim 1, further comprising detecting the current at the first pad and the second pad, wherein the resoilion is compromised if the current is detected at least at one of the first pad arid the second pad.

* * * * *

UNITED STATES PATENT AND TRADEMARK OFFICE
CERTIFICATE OF CORRECTION

PATENT NO. : 6,762,434 B2
DATED : July 13, 2004
INVENTOR(S) : Robert W. Rumsey, Hiu F. Ip and Arthur Lam It is certified that error appears in the above-identified patent and that said Letters Patent is hereby corrected as shown below:

<u>Column 4,</u>
Line 24, where "A method for determine" should read -- A method to determine --.
Lines 46-47, where "wherein the resoil ion" should read -- wherein the resolution --.
Line 48, where "the first pad arid" should read -- the first pad and --.

Signed and Sealed this

Twenty-first Day of December, 2004

JON W. DUDAS
*Director of the United States Patent and Trademark Office*